United States Patent [19]

Hara et al.

[11] Patent Number: 5,591,994

[45] Date of Patent: Jan. 7, 1997

[54] COMPOUND SEMICONDUCTOR FIELD EFFECT TRANSISTOR HAVING A CONTROLLED DIFFUSION PROFILE OF IMPURITY ELEMENTS

[75] Inventors: Naoki Hara; Shigeru Kuroda; Masashi Shima, all of Kawasaki, Japan

[73] Assignee: Fujitsu Limited, Kanagawa, Japan

[21] Appl. No.: 507,638

[22] Filed: Jul. 25, 1995

[30] Foreign Application Priority Data

Aug. 18, 1994 [JP] Japan ................................. 6-193925

[51] Int. Cl.$^6$ ................. H01L 31/0328; H01L 31/0336; H01L 29/80
[52] U.S. Cl. ..................... 257/192; 257/194; 257/280
[58] Field of Search ...................... 257/192, 194, 257/65, 66, 20

[56] References Cited

U.S. PATENT DOCUMENTS

| | | |
|---|---|---|
| 4,665,415 | 5/1987 | Esaki et al. ................ 257/194 |
| 4,755,865 | 7/1988 | Wilson et al. ............... 257/65 |
| 5,161,235 | 11/1992 | Shur et al. ................. 257/194 |
| 5,351,128 | 9/1994 | Goto et al. ................. 257/192 |

FOREIGN PATENT DOCUMENTS 3-106035   5/1991   Japan .

*Primary Examiner*—Wael M. Fahmy
*Attorney, Agent, or Firm*—Armstrong, Westerman, Hattori, McLeland & Naughton

[57] ABSTRACT

A field effect transistor includes a substrate of a compound semiconductor material, source and drain regions formed in the substrate, a channel region defined between the source and said drain regions, a gate electrode provided on the substrate so as to cover the channel region, and a pair of diffusion suppressing regions provided in the substrate respectively at both lateral ends of the channel region, each of the diffusion suppressing regions containing an electrically inert element that suppresses a diffusion of a dopant element therethrough.

13 Claims, 10 Drawing Sheets

COMPOUND SEMICONDUCTOR FIELD EFFECT TRANSISTOR HAVING A CONTROLLED DIFFUSION PROFILE OF IMPURITY ELEMENTS

BACKGROUND OF THE INVENTION

The present invention generally relates to semiconductor devices and more particularly to a compound semiconductor field effect transistor having a diffusion region formed by an ion implantation of a dopant element.

Compound field effect transistors such as HFET (hetetostructure FET) or MESFET provide a very fast operational speed not attainable by conventional Si devices due to the characteristic band structure of the compound semiconductor material used for the device. Thus, compound semiconductor field effect transistors are used extensively for high speed devices for high frequency applications as well as for high speed processors.

In order to increase the operational speed of the device further, it is necessary to reduce the device size as much as possible. In relation to the stringent demand for such a device miniaturization, the self-alignment process developed for the fabrication of silicon devices, is used also in the fabrication of compound semiconductor field effect transistors. In the self-alignment process, source and drain regions are formed in a device substrate by introducing dopant elements thereto while using a gate electrode provided on the substrate as a mask. Since the gate electrode itself is used for the mask, an ideal mask alignment is achieved, even when the device size, such as the gate length, is minimized.

After such a process of ion implantation, a thermal annealing process is conducted for activating the dopant elements thus introduced such that the dopant elements occupy a proper site in the compound semiconductor crystal that forms the active part of the device. On the other hand, such a thermal annealing process tends to induce a diffusion of such dopant elements, while the diffusion of the dopant elements in turn may cause a modification of the distribution profile of the dopant elements in the device.

When the device is an extremely miniaturized one, it should be noted that such a modification of the element distribution profile may induce a corresponding modification of the diffusion region that may result in a modification of the operational characteristics of the device. When the source and drain regions cause a contact, for example, the transistor no longer operates properly.

FIG. 1 shows an example of a conventional compound semiconductor field effect transistor.

Referring to FIG. 1, the field effect transistor is constructed upon a substrate 21 carrying a gate electrode on an upper major surface thereof in correspondence to a channel region that is defined in the substrate 21, wherein the substrate 21 further includes a source region 23 and a drain region 24 at both sides of the channel region. Further, a source electrode 25 and a drain electrode 26 are provided respectively on the source and drain regions 23 and 24.

It should be noted that the structure of FIG. 1 is formed first by providing the gate electrode 22 on the upper major surface of the substrate 21, followed by an ion implantation process of the dopant elements into the substrate 21 while using the gate electrode 22 as a mask. After thermal annealing process to activate the dopant elements, the source and drain regions 23 and 24 are formed as indicated in FIG. 1.

In such a thermal annealing process, it should be noted that the dopant atoms may cause a diffusion and invade into the channel region immediately below the gate electrode 22. When such a diffusion of the dopant element occurs, the leak current of the device increases inevitably even when the device is turned off, and the device characteristic is deteriorated substantially.

In order to avoid such a problem of leak current, it is practiced, in the Si devices, to provide a side wall insulation such that the source and drain regions are separated from each other with a sufficient distance as indicated in FIG. 2.

Referring to FIG. 2, the semiconductor device is constructed upon a substrate 31 that carries a gate electrode 32 on an upper major surface thereof, wherein the gate electrode 32 in turn carries a pair of side wall insulation covers 33 at both lateral side walls thereof, such that the gate electrode 32 and the both side wall insulations covers 33 act together as a self-aligned mask when conducting an ion implantation into the substrate 31 to form source and drain regions 34 and 35 therein. As usual, source and drain electrodes 36 and 37 are provided on the source and drain regions 34 and 35 respectively, after a thermal annealing process to activate the dopant element in the source and drain regions 34 and 35. In the structure of FIG. 2, it should be noted that the problem of the source and drain regions 34 and 35 approaching excessively or even overlapping with each other, is effectively eliminated due to the increased separation between the source and drain regions 34 and 35.

While the structure of FIG. 2 may be effective for eliminating the foregoing problem of the source and drain regions 34 and 35 contacting with each other, such a structure has an obvious and inevitable drawback of increased gate length and hence a reduced operational speed of the device. In other words, the device of FIG. 2 eliminates the leak current by sacrificing the operational performance of the device. Conventionally, there has been no effective structure nor a fabrication process thereof to achieve a high integration density for a compound field effect transistor integrated circuit while simultaneously eliminating the diffusion of the dopant element into the channel region of the device.

SUMMARY OF THE INVENTION

Accordingly, it is a general object of the present invention to provide a novel and useful compound semiconductor field effect transistor and a fabrication process thereof wherein the foregoing problems are successfully eliminated.

Another and more specific object of the present invention is to provide a compound semiconductor field effect transistor having source and drain regions, wherein the diffusion of dopant element from the source or drain region into a channel region defined between the source and drain regions, is effectively eliminated.

Another object of the present invention is to provide a field effect transistor, comprising:

a substrate of a compound semiconductor material;

a source region formed in said substrate, said source region containing a dopant element;

a drain region formed in said substrate with a separation from said source region, said drain region containing said dopant element;

a channel region defined in said substrate between said source region and said drain region, said channel region having a first end adjacent to said source region and a second, opposite end adjacent to said drain region;

a gate electrode provided on said substrate so as to cover said channel region;

a pair of diffusion suppressing regions provided in said substrate respectively at said first and second ends of said channel region with a mutual separation from each other, each of said diffusion suppressing regions containing an electrically inert element and suppressing a diffusion of said dopant element therethrough.

Another object of the present invention is to provide a method for fabricating a field effect transistor, comprising the steps of:

(a) introducing a dopant element into a substrate of a compound semiconductor material at predetermined first and second regions respectively corresponding to source and drain regions, such that said first and second regions are separated from each other laterally by a third region corresponding to a channel region, said third region thereby being defined by a first boundary adjacent to said first region and a second boundary adjacent to said second region;

(b) introducing an element that suppresses a diffusion of said dopant element in said semiconductor material, into said substrate selectively in the vicinity of said first and second boundaries; and (c) after said steps (a) and (b), conducting a thermal annealing process for causing a diffusion of said dopant element in said substrate to form said source and drain regions.

According to the present invention, one can fabricate a miniaturized, high speed compound semiconductor field effect transistor without causing invasion of dopant elements into the channel region from any of the source and drain regions, even when the device size is reduced and the gate length of the device minimized, due to the blocking action of the element that is introduced to the first and/or second boundaries of the channel region.

Another object of the present invention is to provide a method for fabricating a semiconductor device, comprising:

(a) introducing a dopant element into a substrate of a compound semiconductor material at a first region;

(b) introducing an element that suppresses a diffusion of said dopant element in said semiconductor material, into said substrate at a second region laterally adjacent to said first region; and (c) after said steps (a) and (b), conducting a thermal annealing process for causing a diffusion of said dopant element in said substrate to form a diffusion region, such that said diffusion region does not extend laterally beyond said second region.

According to the present invention, one can provide a compound semiconductor device with an excellent control of the lateral boundary of the diffusion region formed therein.

Another object of the present invention is to provide a method for fabricating a semiconductor device, comprising the steps of:

(a) introducing F ions into a substrate that contains Ga and As;

(b) introducing Mg ions into said substrate; and (c) after said steps of (a) and (b), conducting a thermal annealing process to cause a diffusion of said Mg ions in said substrate.

According to the present invention, one can effectively control the diffusion of Mg dopant in a GaAs substrate by introducing F as a diffusion blocking element.

Another object of the present invention is to provide a method for fabricating a semiconductor device, comprising the steps of:

(a) introducing Ar ions into a substrate of AlGaAs;

(b) introducing Mg ions into said substrate; and (c) after said steps of (a) and (b), conducting a thermal annealing process to cause a diffusion of said Mg ions in said substrate.

According to the present invention, one can effectively control the diffusion of Mg dopant in a AlGaAs substrate by introducing Ar as a diffusion blocking element.

Other objects and further features of the present invention will become apparent from the following detailed description when read in conjunction with the attached drawings.

DETAILED DESCRIPTION OF THE PREFERRED EMBODIMENTS

Figure 1:
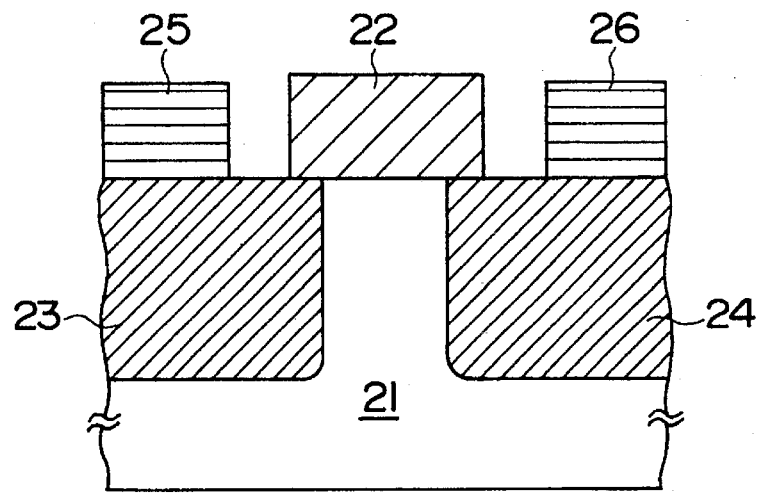
FIG. 1 is a diagram showing the construction of a conventional field effect transistor.
Figure 2:
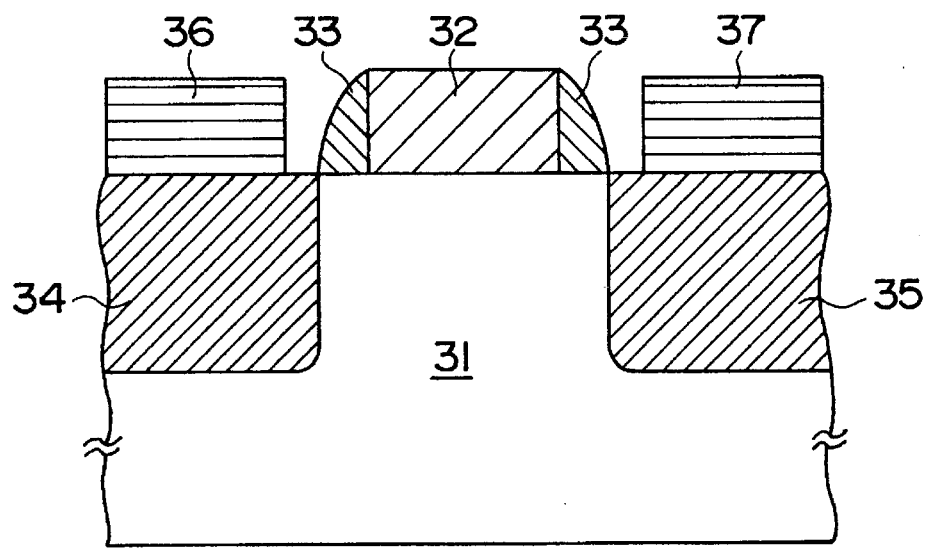
FIG. 2 is a diagram showing another example of the conventional field effect transistor.

First, the principle of the present invention will be described.

The present invention provides a compound semiconductor field effect transistor having source and drain regions formed by ion implantation of a dopant element such as Mg, Be or Si into a compound semiconductor substrate, wherein the diffusion of the dopant element into the channel region formed between the source and drain regions is effectively suppressed by introducing an electrically inert element such as F or Ar at both lateral ends of the channel region. Thereby, the electrically inert element act as an effective diffusion suppressor. Thereby, the ion implantation is conducted such that the diffusion suppressor element does not penetrate beyond the depth of the channel layer when the gate length is relatively long as compared to the channel thickness. By controlling the doping of the diffusion suppressing element as such, the leak current flowing laterally across the channel region is minimized, and simultaneously the damage to the channel layer as a result of the ion implantation of the diffusion suppressor is minimized.

When the gate length of the device is short, on the other hand, the ion implantation of the diffusion suppressing element is conducted to the depth equal to or lower than the bottom boundary of the channel layer. Thereby, the leak current flowing laterally across the channel region as well as the leak current flowing vertically away from the channel region is effectively suppressed by eliminating the dopant elements from the channel region as well as the region thereunder. It should be noted that one can use F as an effective diffusion suppressor element against the diffusion of Mg in GaAs.

The present invention is applicable to a HFET in which a barrier layer of undoped AlGaAs having a composition of $Al_xGa_{1-x}As$ is provided on a channel layer of InGaAs of which composition is represented as $In_yGa_{1-y}As$, wherein one can use Ar for the diffusion suppressor when the compositional parameter E is set equal to or larger than 0.5. The compositional parameter y in turn is generally held equal to or smaller than 0.3 for avoiding lattice misfit between the channel layer and the substrate of GaAs.

According to the present invention, one can minimize the gate length of the device by minimizing the separation between the source region and the drain region without inviting any increase of the gate leak current that is induced by the dopant element invading into the channel region of the device from the source or drain region. It should be noted that the present invention provides a superior suppression of the gate leak current over the conventional LDD (lightly doped drain) device in which a lightly doped drain region of reduced dopant concentration level is provided between the drain region and the channel region for reducing the gate leak current and for improving the breakdown characteristics.

It is noted that there is a proposal of a GaAs HFET in the Japanese Laid-open Patent Publication 3-106035 in which a vertical profile of Si dopant is controlled by introducing F ions into the substrate at a predetermined depth including the region located below the gate electrode, so as to eliminate the vertical diffusion of the dopant element beyond the depth of the F ions. As a result of formation of such a F-containing layer acting as the diffusion suppressor, a sharply defined profile is guaranteed for the vertical distribution of the dopant element in the source and drain regions, and improvement is achieved in the device characteristics such as improved transconductance and reduced scatter of the threshold voltage.

The present invention, on the other hand, is distinguished over the reference device in that the diffusion suppressor element is introduced selectively at both lateral ends of the channel region so as to eliminate the lateral diffusion of the dopant element from the source region or drain region to the channel region, not for suppressing the vertical diffusion of the dopant element. In relation to this feature of the present invention, it should be noted that the region immediately under the gate electrode is more or less free from the diffusion suppressor element in the present invention and damage to the channel layer is minimized. Associated therewith, the problem of scattering of the carriers in the channel layer by the diffusion suppressor element is also minimized.

In the present invention, the diffusion suppressor element is introduced to the depth of the lower boundary of the channel region or deeper, when the gate length of the transistor is small as noted already. By doing so, the diffusion of the dopant element is successfully eliminated from the path of the carriers in the device having a short channel length in which a substantial gate leak current occurs not only laterally but also vertically in the direction away from the channel region.

When the channel length of the device is relatively long, on the other hand, little gate leak current occurs in the vertical direction of the device. Thus, it is sufficient to block the diffusion of the dopant element only in the lateral or horizontal direction at the surface part of the substrate where the channel of the carriers is formed. By reducing the depth of penetration of the diffusion suppressor element, it is possible to minimize the damage to the semiconductor crystal forming the channel region.

Figure 3:
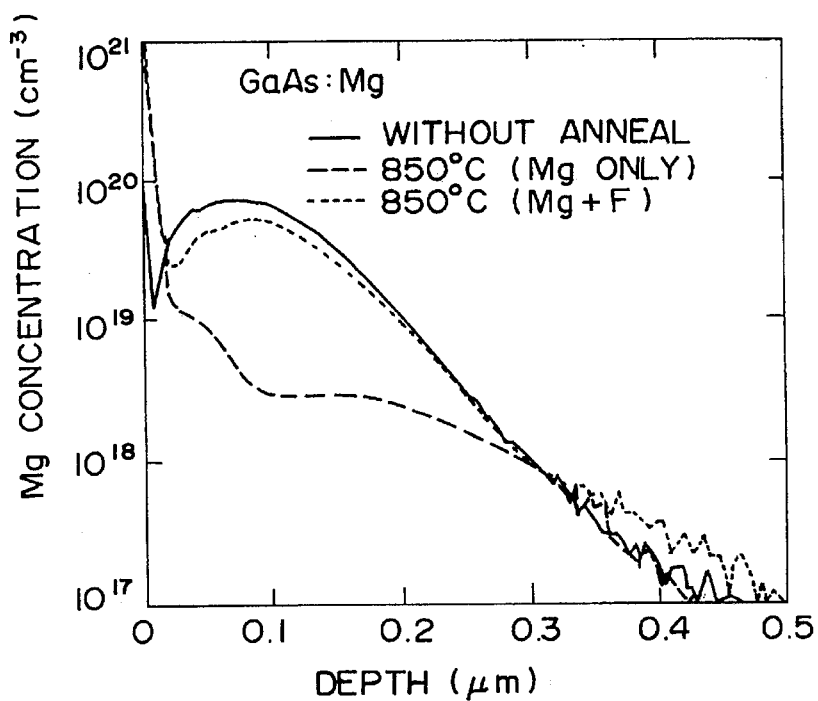
FIG. 3 is a diagram showing the effect of F ions for suppressing the diffusion of Mg in a GaAs crystal.

FIG. 3 shows the effect of F as a diffusion suppressor element in a GaAs substrate doped to the p-type by introducing Mg, wherein the horizontal axis indicates the depth from the surface of the substrate while the vertical axis represents the concentration of Mg obtained as a result of SIMS analysis.

Referring to FIG. 3, the continuous line indicates the Mg distribution profile immediately after the ion implantation conducted with an acceleration voltage of 60 keV and a dose of $1\times10^{15}$ $cm^{-2}$, while the broken line indicates the distribution profile of Mg thus introduced after a thermal annealing process applied at 850° C. for 5 seconds. Further, the dotted line indicates the distribution profile of Mg similarly introduced to the GaAs substrate in which F ions are injected further to the substrate, followed by a thermal annealing process conducted at 850° C. for 5 seconds. The injection of F was conducted under the acceleration voltage of 20 keV with a dose of $1\times10^{15}$ $cm^{-2}$.

In FIG. 3, it will be noted that the distribution profile of Mg changes significantly after the thermal annealing process when Mg alone is introduced, indicating that a substantial diffusion of Mg has occurred into the interior of the GaAs substrate. When F is introduced in addition to Mg, on the other hand, the distribution profile of Mg changes little even after a thermal annealing process. This clearly indicates the effect of F acting as an effective diffusion suppressor of Mg in a GaAs crystal. A similar result was observed also for Be, wherein it was confirmed that the diffusion of Be, introduced to the GaAs substrate by an ion implantation process conducted with an acceleration voltage of 20 keV and a dose of $1\times10^{15}$ $cm^{-2}$, is effectively suppressed by introducing Ar ions by an ion implantation process under an acceleration voltage of 50 keV with a dose of $1\times10^{15}$ $cm^{-2}$. Further, it was demonstrated that the diffusion of Si is also suppressed by incorporating F or Ar to the GaAs substrate.

Figure 4:
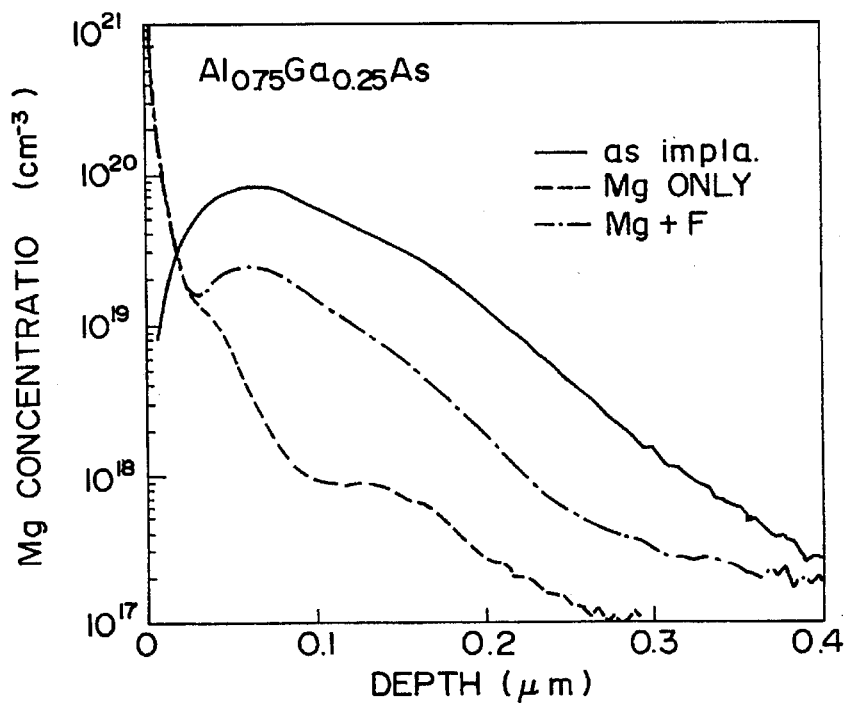
FIG. 4 is a diagram showing the effect of Ar ions for suppressing the diffusion of Mg in a AlGaAs crystal.

FIG. 4 is a diagram similar to FIG. 3 showing the distribution profile of Mg in a substrate of AlGaAs, wherein the continuous line indicates the distribution profile of Mg immediately after the ion implantation similarly as before. On the other hand, the broken line indicates the distribution profile of Mg after a thermal annealing process at 850° C. for 5 seconds for the case where Mg alone is introduced. Further, the dotted line indicates the distribution profile of Mg after the thermal annealing process for the case in which F is introduced in addition to Mg as a diffusion suppressor element.

As can be seen clearly in FIG. 4, the distribution profile represented by the broken line changes significantly with respect to the distribution profile represented by the continuous line, indicating that a substantial diffusion of Mg has occurred to the interior of the AlGaAs substrate. When F is introduced in addition to Mg, on the other hand, the change of the distribution profile of Mg is less significant as indicated by the dotted line. Thus, FIG. 4 also indicates the effect of F as a diffusion suppressor element of Mg in an AlGaAs crystal. Further, it was found that Ar can be used as a diffusion suppressor element for suppressing diffusion of Mg or Be in an AlGaAs crystal having a composition represented by $Al_xGa_{1-x}As$, provided that the compositional parameter x is equal to or larger than 0.5.

Hereinafter, the present invention will be described with reference to preferred embodiment.

[first embodiment]

Figure 5:
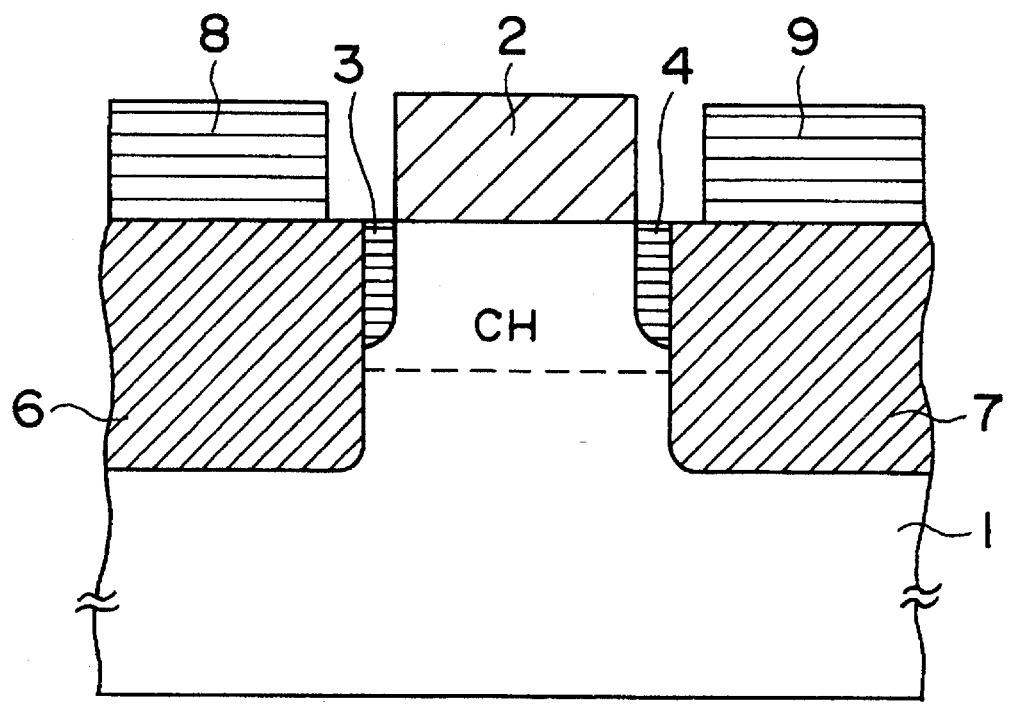
FIG. 5 is a diagram showing the construction of a field effect transistor according to a first embodiment of the present invention.

FIG. 5 shows the overall construction of a MISFET according to a first embodiment of the present invention.

Referring to FIG. 5, the HFET is constructed upon a substrate 1 of a compound semiconductor material in which source and drain regions 6 and 7 are formed, wherein the source and drain regions 6 and 7 are separated from each other in the substrate 1 by a channel CH of the carriers defined between the source and drain regions 6 and 7. Further, a gate electrode 2 is provided on the surface of the substrate 1 so as to cover a region corresponding to the channel CH, and source and drain electrodes 8 and 9 are provided respectively on the source and drain regions 6 and 7. As will be described later with reference to the fabrication process, the HFET of FIG. 5 includes a barrier layer under the gate electrode 2 for minimizing the gate current.

Further, it will be noted that the HFET of FIG. 5 includes diffusion suppressing regions 3 and 4 respectively between the source region 6 and the channel CH and between the drain region 7 and the channel CH wherein each of the regions 3 and 4 contains a diffusion suppressing element such as F or Ar that effectively suppresses the diffusion of the dopant element forming the source and drain regions 6 and 7 therethrough. As will be explained in detail below, each of the regions 3 and 4 is formed by an ion implantation of the diffusion suppressing element into the compound semiconductor material forming the substrate 1.

It should be noted that the diffusion suppressing element thus introduced becomes inert when incorporated into the crystal structure of the compound semiconductor material forming the substrate 1. By providing such diffusion suppressing regions 3 and 4 at the boundary between the source region 6 and the channel CH or between the drain region 7 and the channel CH, it is possible to eliminate the diffusion of the dopant element from the source or drain region into the channel CH, even when the device size is extremely miniaturized. Thereby, one can successfully eliminate the gate leak current and a miniaturized high speed field effect transistor suitable for integrated circuits of very large integration density is successfully obtained without deteriorating the device characteristics.

Hereinafter, the fabrication process of the device of FIG. 5 will be described in detail with reference to FIGS. 6A–6G. In the drawings, those parts described previously are designated by the same reference numerals and the description thereof will be omitted. It should be noted that the scale of the illustration is not proportional and may change variously in each of the drawings.

Figure 6A:
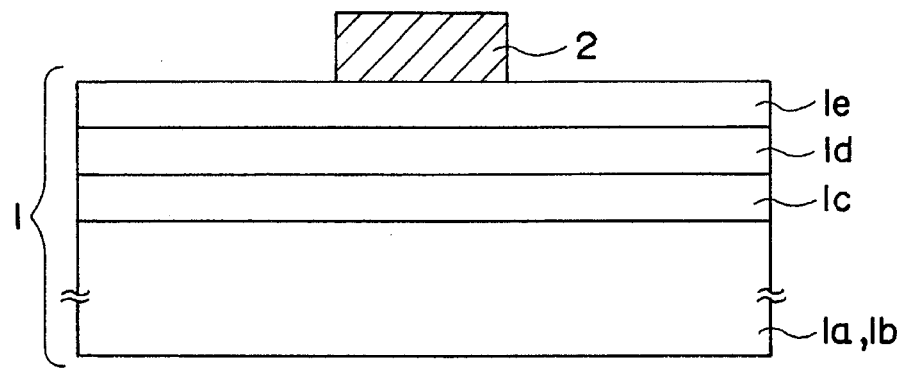
FIGS. 6A–6G are diagrams showing the fabrication process of a long channel HFET according to various embodiments of the present invention.

Referring to FIG. 6A, a buffer layer 1b of undoped GaAs is provided on a semi-insulating GaAs substrate 1a with a thickness of 500 nm, and a channel layer 1c of InGaAs having a composition of $In_yGa_{1-y}As$ is provided further on the buffer layer 1b with a thickness of 10 nm, wherein the compositional parameter y is preferably set so as to fall in a range between 0 and 0.3 ($0 \leq y \leq 0.3$) for avoiding a lattice misfit with respect to the GaAs substrate 1a. In the description hereinafter, the compositional parameter y is set to a preferable value of 0.2. Further, a barrier layer 1d of undoped AlGaAs is provided on the channel layer 1c with a thickness of 30 nm, and a cap layer 1e of undoped GaAs is provided further thereon with a thickness of 10 nm, wherein the barrier layer 1c has a composition represented as $Al_xGa_{1-x}As$, with the compositional parameter x set preferably equal to or larger than 0.5. Thereby, the layers 1a–1e collectively form the substrate 1 of FIG. 3. Further, a WSi layer is deposited on the structure thus obtained by a sputtering process, followed by a photolithographic patterning process to form the gate electrode 2 in contact with the cap layer 1e such that the gate electrode 2 has a gate length of 0.8 μm and a gate width of 100 μm.

Figure 6B:
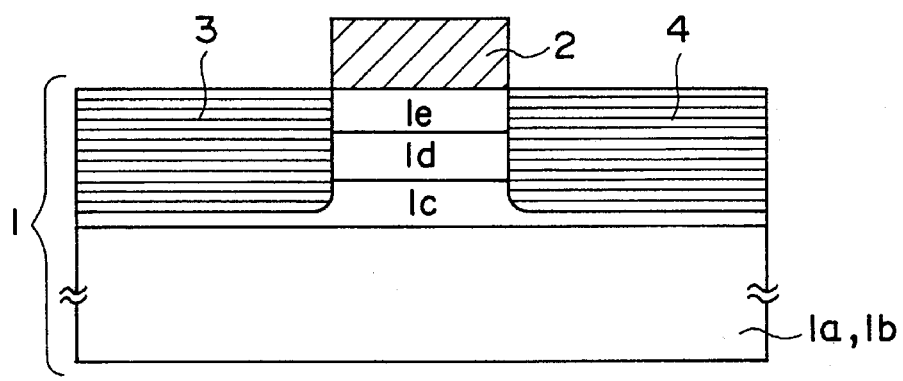

Next, in the step of FIG. 6B, an ion implantation of F is conducted into the substrate 1 while using the gate electrode 2 as a mask with an acceleration voltage of 15 keV and a dose of $1 \times 10^{15}$ $cm^{-2}$, wherein the F ions thus introduced suppress the diffusion of Mg ions to be introduced later when forming the source and drain regions 5 and 6. As a result of the ion implantation of F, the regions 3 and 4 containing F ions are formed at both lateral sides of the gate electrode 2 with a thickness of 45 nm in correspondence to the foregoing acceleration voltage of 15 keV.

Figure 6C:
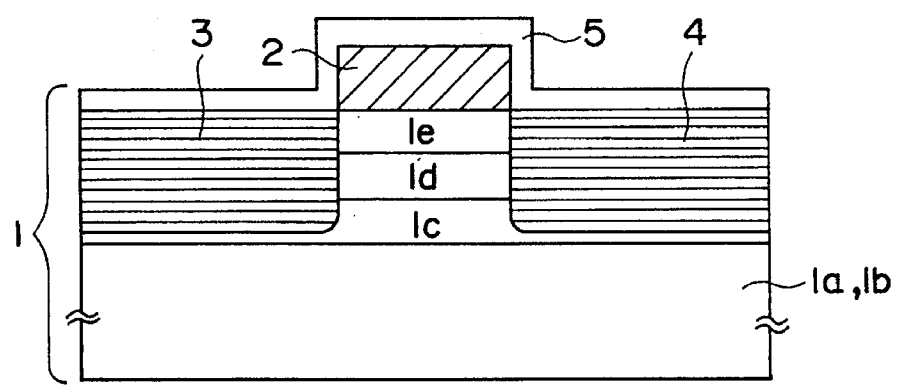
Figure 6D:
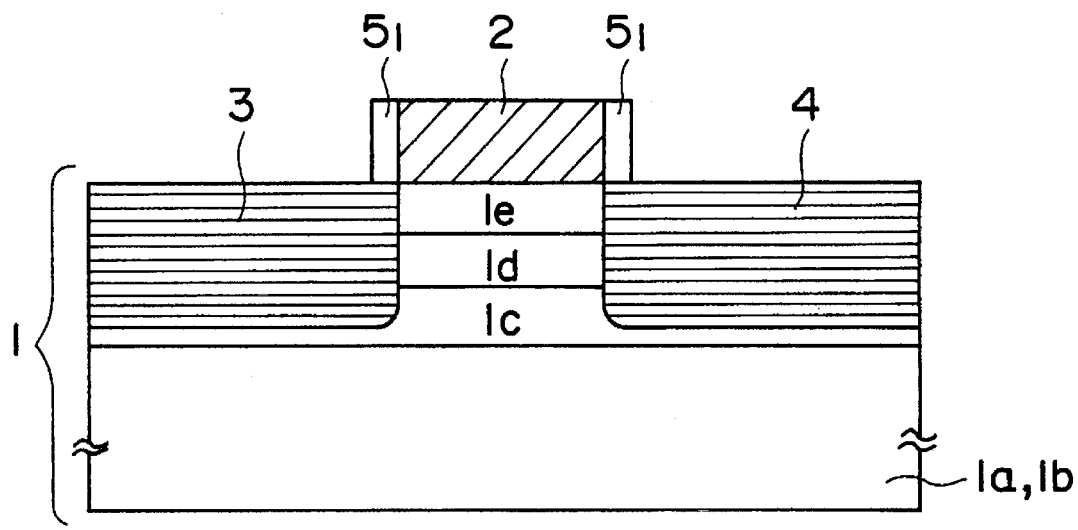

Next, the step of FIG. 6C is conducted subsequently to deposit a $SiO_2$ film 5 on the entire surface of the structure of FIG. 6B with a thickness of 50 nm, followed by an anisotropic etching process of the $SiO_2$ film 5, to form side wall covers $5_1$ at both lateral side walls of the gate electrode 2 as indicated in FIG. 6D. Typically, the anisotropic etching process is conducted by a dry etching process and proceeds vertically to the upper major surface of the substrate 1.

Figure 6E:
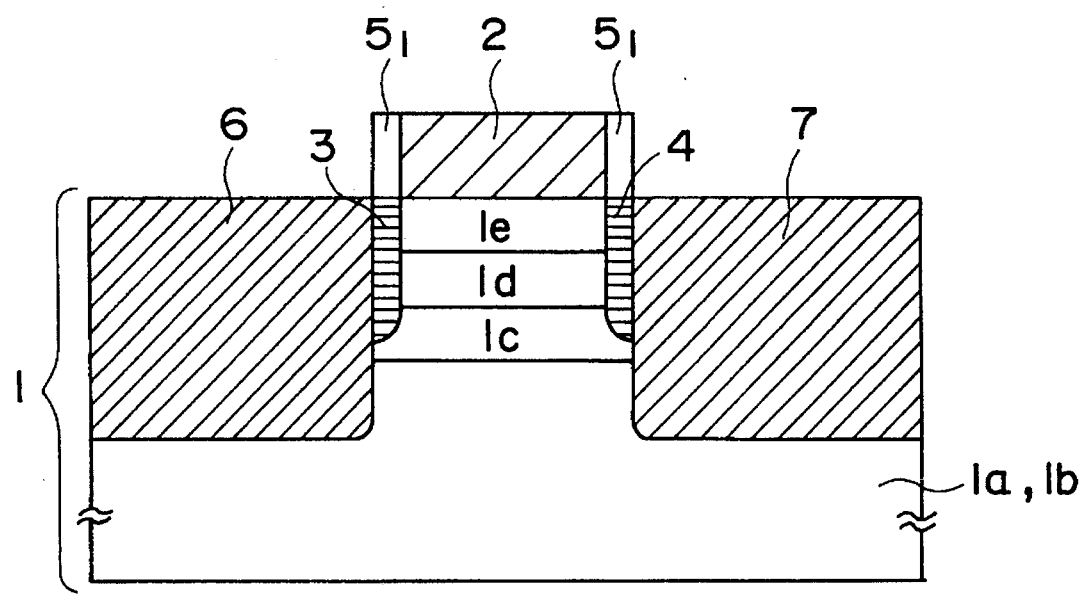

Further, in the step of FIG. 6E, an ion implantation process of Mg is conducted under the acceleration voltage of 60 keV and the dose of $1 \times 10^{15}$ $cm^{-2}$ while using the gate electrode 2 as well as the $SiO_2$ covers $5_1$ thereof as a mask, to form the source and drain regions 6 and 7.

Figure 6F:
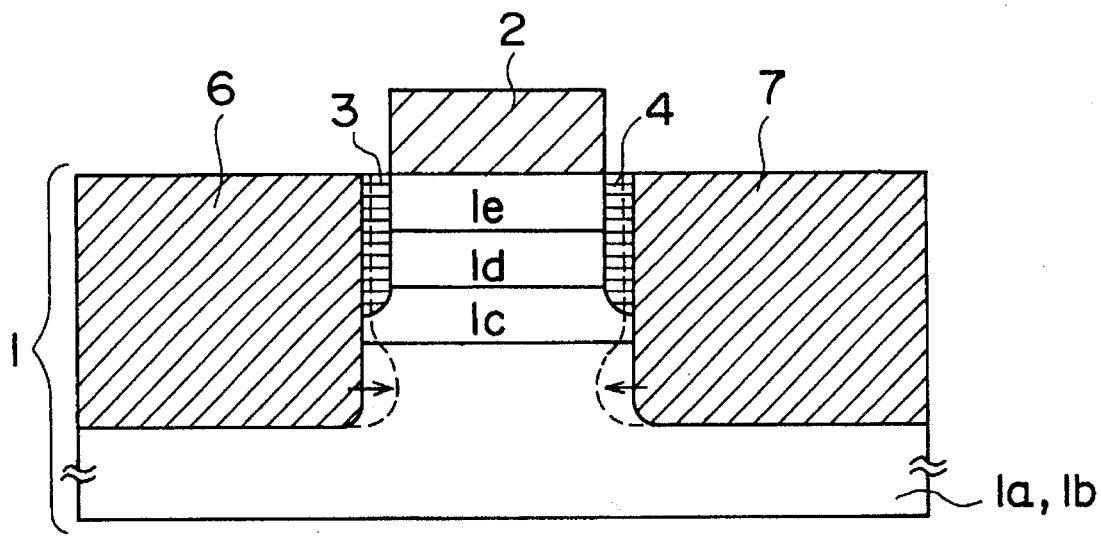

Next, the both side wall covers $5_1$ are removed, and a thermal annealing process is conducted at 800° C. for 5 seconds in the step of FIG. 6F so as to activate the Mg ions introduced in the step of FIG. 6E. Typically, the thermal annealing process is conducted by heating the substrate 1 by a halogen lamp. As a result of such a thermal annealing process, the Mg ions in the source and drain regions 6 and 7 are thermally agitated so as to cause a diffusion into the region between the source and drain regions 6 and 7 as indicated by arrows, while such a diffusion is effectively suppressed by the regions 3 and 4 that contains the F ions. Thus, the channel region immediately under the gate electrode 2 is held substantially free from the diffusion of Mg from the source and drain regions 6 and 7.

Figure 6G:
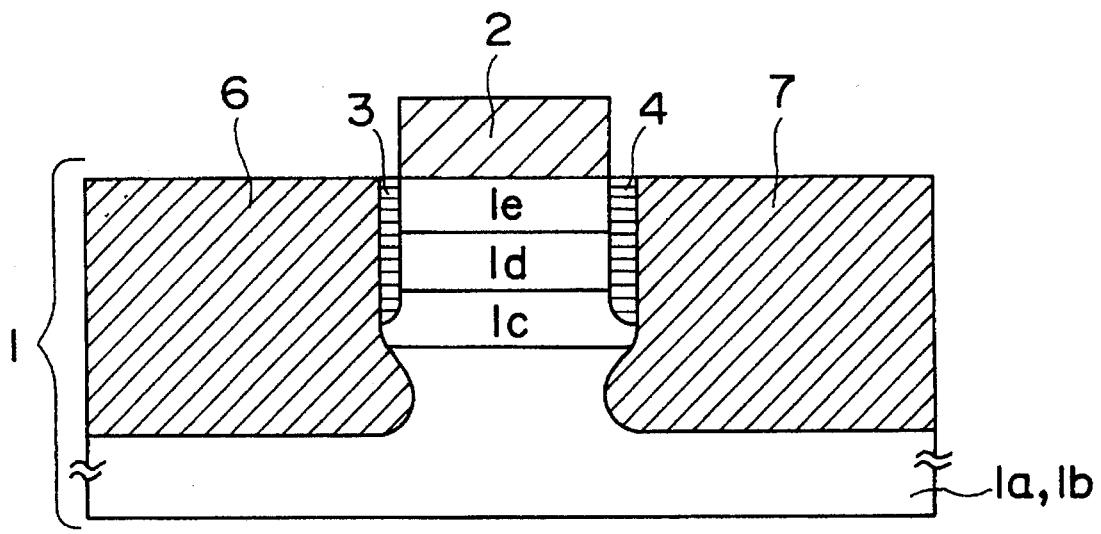

Finally, the step of FIG. 6G is conducted for depositing a conductor layer formed of a stacking of Au/Zn/Au layers, followed by a patterning of the same to form the source and drain electrodes 8 and 9.

In the field effect transistor thus formed, one can successfully reduce the distance between the source region 6 and the gate electrode 2 or the distance between the drain region 7 and the gate electrode 2 to 50 nm without causing any substantial increase of the gate current leak. This is a substantial improvement over the conventional device in which the distance between the source region 6 and the gate electrode 2 or the distance between the drain region 7 and the gate electrode 2 has to be set at least 200–250 nm for avoiding the gate current leak.

In the present example where the gate length is set to 0.8 μm, it should be noted that the depth of 45 nm for the regions 3 and 4 is smaller than the depth of the bottom boundary of the channel CH that is formed in the channel layer 1c by the carriers. In other words, the depth of the regions 3 and 4 does not exceed the lower boundary of the channel CH as indicated in FIG. 6G. As the gate length is relatively large in the present case, the short-channel effect does not appear significantly, and such relatively shallow diffusion suppressing regions 3 and 4 are sufficient for eliminating the lateral diffusion of the dopant element and hence the gate leak current.

[second embodiment]

Next, a second embodiment of the present invention will be described with reference to FIGS. 7A–7G.

In the present embodiment, a long gate MESFET is formed while introducing F ions directly into a semi-insulating GaAs substrate as a diffusion suppressor element for suppressing the diffusion of Mg ions that are introduced into the GaAs substrate to form the source and drain regions.

Figure 7A:
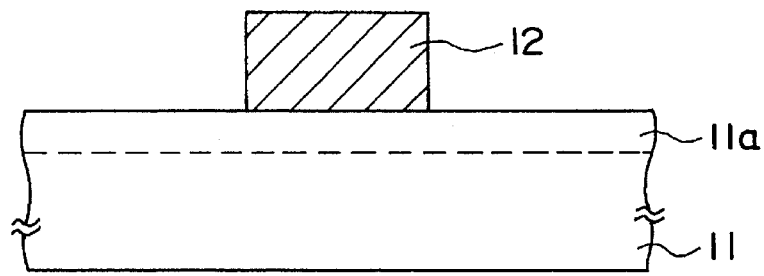
FIGS. 7A–7G are diagrams showing the fabrication process of a long channel MESFET according to various embodiments of the present invention.

Referring now to FIG. 7A, an ion implantation process of Mg is conducted upon a semi-insulating GaAs substrate 11 with an acceleration voltage of 50 keV and a dose of $2\times10^{12}$ cm$^{-2}$, to form a p-type channel layer 11a therein with a thickness of 50 nm. The channel layer thus formed may correspond to the channel layer 1c of FIG. 6A. Further, a WSi layer is deposited on the substrate 11 by a sputtering process, followed by a photolithographic patterning process to form a gate electrode 12 such that the gate electrode 2 forms a gate structure having a gate length of 0.8 μm and a gate width of 100 μm.

Figure 7B:
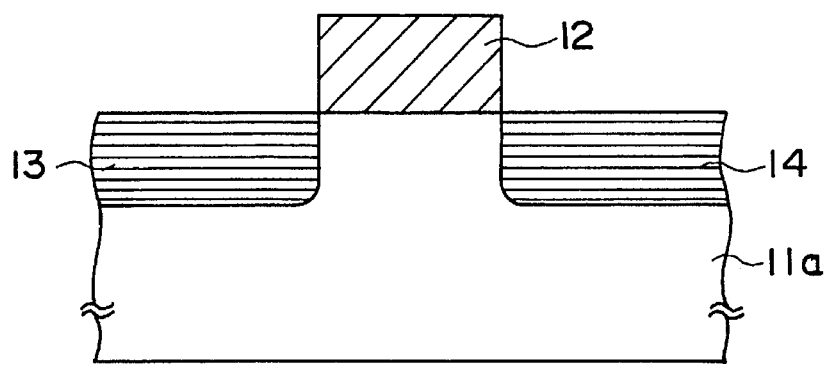

Next, in the step of FIG. 7B, an ion implantation of F is conducted into the substrate 11 while using the gate electrode 12 as a mask with an acceleration voltage of 15 keV and a dose of $1\times10^{15}$ cm$^{-2}$ wherein the F ions thus introduced act to suppress the diffusion of Mg ions to be introduced later when forming the source and drain regions. As a result of the ion implantation of F, regions 13 and 14 containing F ions are formed at both lateral sides of the gate electrode with a thickness of 45 nm in correspondence to the foregoing acceleration voltage of 15 keV.

Figure 7C:
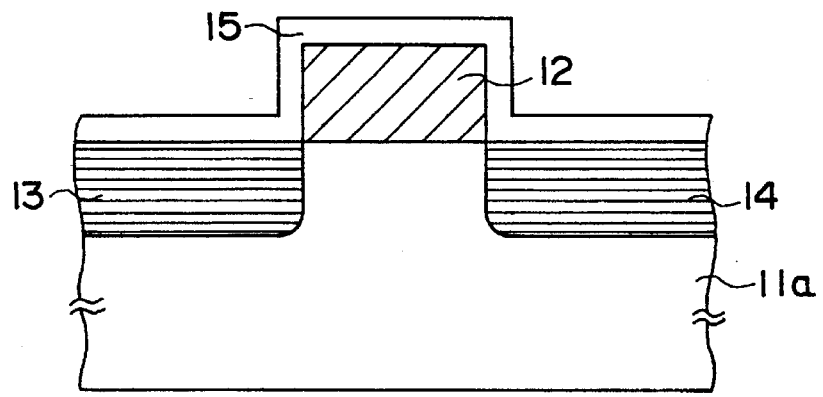
Figure 7D:
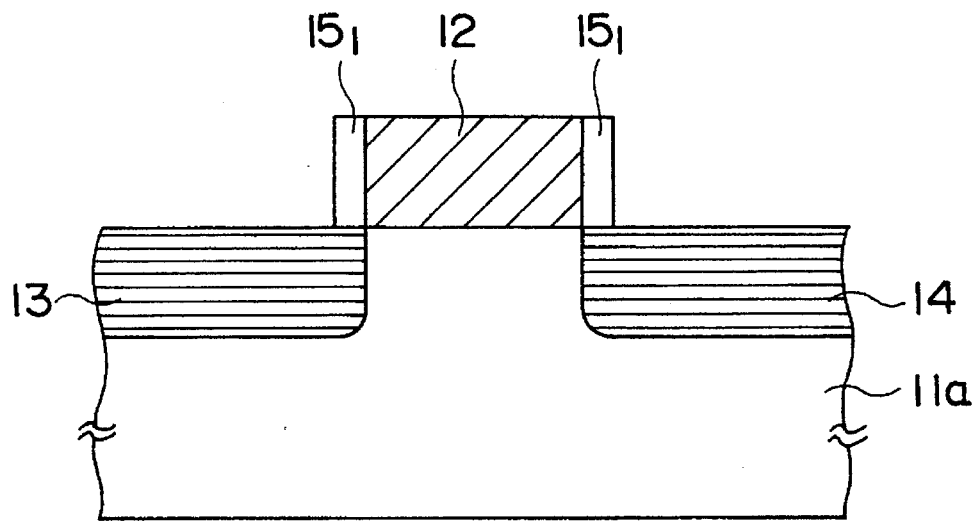

Next, the step of FIG. 7C is conducted subsequently to deposit a SiO$_2$ film 15 on the entire surface of the structure of FIG. 7B with a thickness of 50 nm, followed by an anisotropic etching process of the SiO$_2$ film 15, to form side wall covers 15$_1$ at both side walls of the gate electrode 12 as indicated in FIG. 7D. Typically, the anisotropic etching process is conducted by a dry etching process.

Figure 7E:
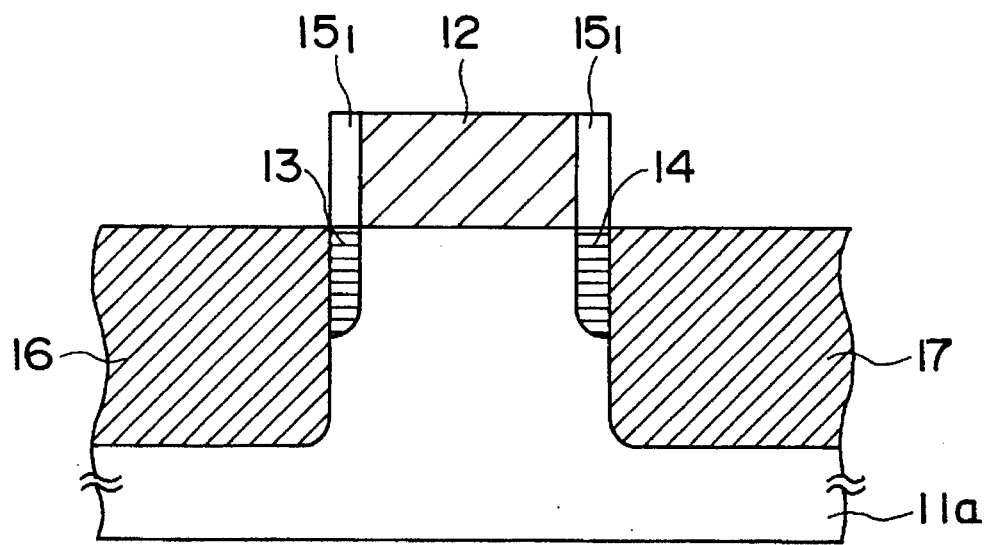

Further, in the step of FIG. 7E, an ion implantation process of Mg is conducted under the acceleration voltage of 60 keV and the dose of $1\times10^{15}$ cm$^{-2}$ while using the gate electrode 12 as well as the SiO$_2$ covers 15$_1$ thereof as a mask, to form source and drain regions 16 and 17.

Figure 7F:
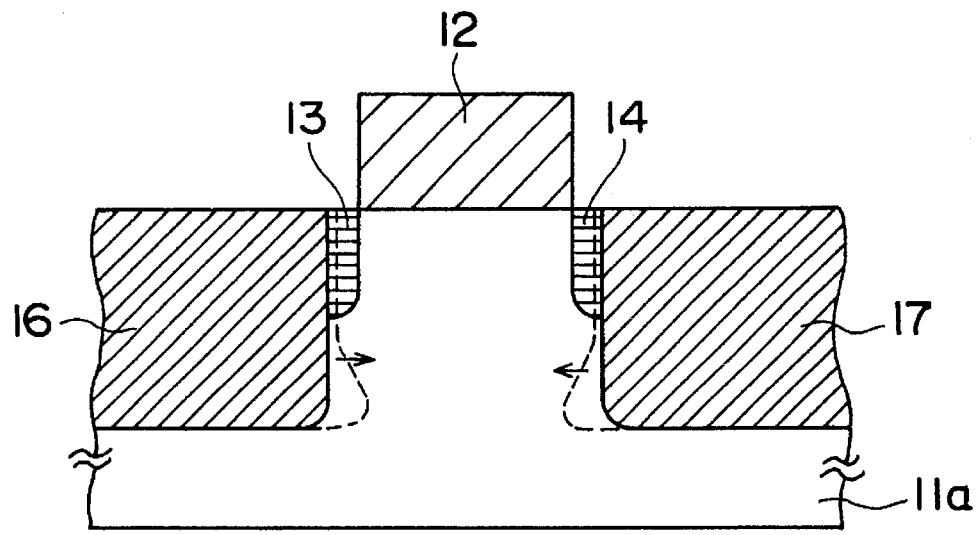

Next, the both side wall covers 15$_1$ are removed, and a thermal annealing process is conducted at 800° C. for 5 seconds in the step of FIG. 7F so as to activate the Mg ions introduced in the step of FIG. 7E. Typically, the thermal annealing process is conducted by heating the substrate 11 by a halogen lamp. As a result of such a thermal annealing process, the Mg ions in the source and drain regions 16 and 17 are thermally agitated so as to cause a diffusion into the region between the source and drain regions 16 and 17 as indicated by arrows, while such a diffusion is effectively suppressed by the regions 13 and 14 that contains the F ions. Thus, the channel region immediately under the gate electrode 12 is held substantially free from the diffusion of Mg from the source and drain regions 16 and 17.

Figure 7G:
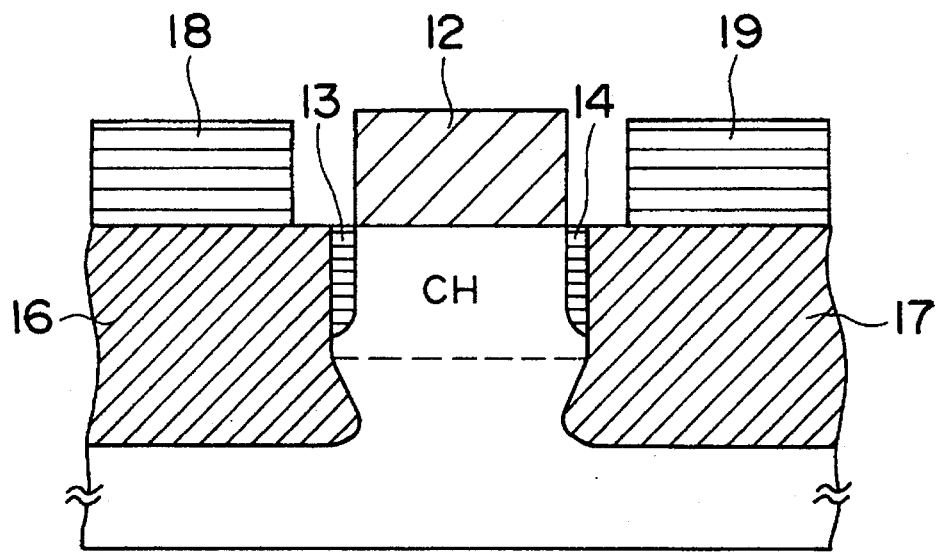

Finally, the step of FIG. 7G is conducted for depositing a conductor layer formed of a stacking of Au/Zn/Au layers, followed by a patterning of the same to form source and drain electrodes 18 and 19.

In the field effect transistor thus formed, one can successfully reduce the distance between the source region 16 and the gate electrode 12 or the distance between the drain region 17 and the gate electrode 12 to 50 nm without causing any substantial increase of the gate current leak similarly to the first embodiment.

In the present example, too, the depth of 45 nm for the regions 13 and 14 is smaller than the depth of the bottom boundary of the channel CH formed in the channel layer 11a in correspondence to the relatively large gate length of 0.8 μm. In other words, the depth of the regions 13 and 14 does not exceed the lower boundary of the channel CH as indicated in FIG. 7G, similarly to the previous embodiment. Further, it should be noted that one may use Be for the dopant of the source and drain regions 15 and 16. In this case, the ion implantation is conducted with an acceleration voltage of 20 keV and a dose of $1\times10^{15}$ cm$^{-2}$. Further, one may use Ar in place of F for suppressing the diffusion of the dopant element. When Ar is used, it is preferred to conduct the ion implantation process with an acceleration voltage of 50 keV and a dose of $1\times10^{15}$ cm$^{-2}$.

[third embodiment]

In the present embodiment, a HFET similar to that described with reference to the first embodiment is fabricated, wherein the gate length of the device is set to 0.3 μm that is substantially smaller than the gate length of the device of the first embodiment. As a result, the device of the present embodiment exhibits a conspicuous short-channel effect. The gate width, on the other hand, is set to 100 μm similarly as before.

As the fabrication process is similar to the process of the first embodiment, the description hereinafter for the present embodiment will be made with reference to FIGS. 6A–6F as well as a new drawing of FIG. 8.

Referring to FIG. 6A, the buffer layer 1b of undoped GaAs is provided on the semi-insulating GaAs substrate 1a with a thickness of 500 nm, and the channel layer 1c of InGaAs having a composition of In$_{0.2}$Ga$_{0.8}$As is provided further on the buffer layer 1b with a thickness of 10 nm similarly as before. Further, the barrier layer 1d of undoped AlGaAs is provided on the channel layer 1c with a thickness of 30 nm, and the cap layer 1e of undoped GaAs is provided further thereon with a thickness of 10 nm. Further, a WSi layer is deposited on the structure thus obtained by a sputtering process, followed by a photolithographic patterning process to form the gate electrode 2 in contact with the barrier layer 1d such that the gate electrode 2 has a gate length of 0.3 μm and a gate width of 100 μm.

Next, in the step of FIG. 6B, an ion implantation of F is conducted into the substrate 1 while using the gate electrode 2 as a mask with an acceleration voltage of 20 keV and a dose of $1\times10^{15}$ cm$^{-2}$, wherein the F ions thus introduced suppress the diffusion of Mg ions to be introduced later when forming the source and drain regions 5 and 6. As a result of the ion implantation of F, the regions 3 and 4 containing F ions are formed at both lateral sides of the gate electrode 2 with a thickness of 60 nm in correspondence to the foregoing acceleration voltage of 20 keV.

Next, the step of FIG. 6C is conducted subsequently to deposit the SiO$_2$ film 5 on the entire surface of the structure of FIG. 6B with a thickness of 50 nm, followed by an anisotropic etching process of the SiO$_2$ film 5, to form side wall covers 5$_1$ at both lateral side walls of the gate electrode 2 as indicated in FIG. 6D. Typically, the anisotropic etching process is conducted by a dry etching process.

Further, in the step of FIG. 6E, an ion implantation process of Mg is conducted under the acceleration voltage of 60 keV and the dose of $1\times10^{15}$ cm$^{-2}$ while using the gate electrode 2 as well as the SiO$_2$ covers $5_1$ thereof as a mask, to form the source and drain regions 6 and 7.

Next, the side wall covers $5_1$ are removed, and a thermal annealing process is conducted at 800° C. for 5 seconds in the step of FIG. 6F so as to activate the Mg ions introduced in the step of FIG. 6E. Typically, the thermal annealing process is conducted by heating the substrate 1 by a halogen lamp. As a result of such a thermal annealing process, the Mg ions in the source and drain regions 6 and 7 are thermally agitated so as to cause a diffusion into the region between the source and drain regions 6 and 7 as indicated by arrows, while such a diffusion is effectively suppressed by the regions 3 and 4 that contains the F ions. Thus, the channel region immediately under the gate electrode 2 is held substantially free from the diffusion of Mg from the source and drain regions 6 and 7.

Figure 8:
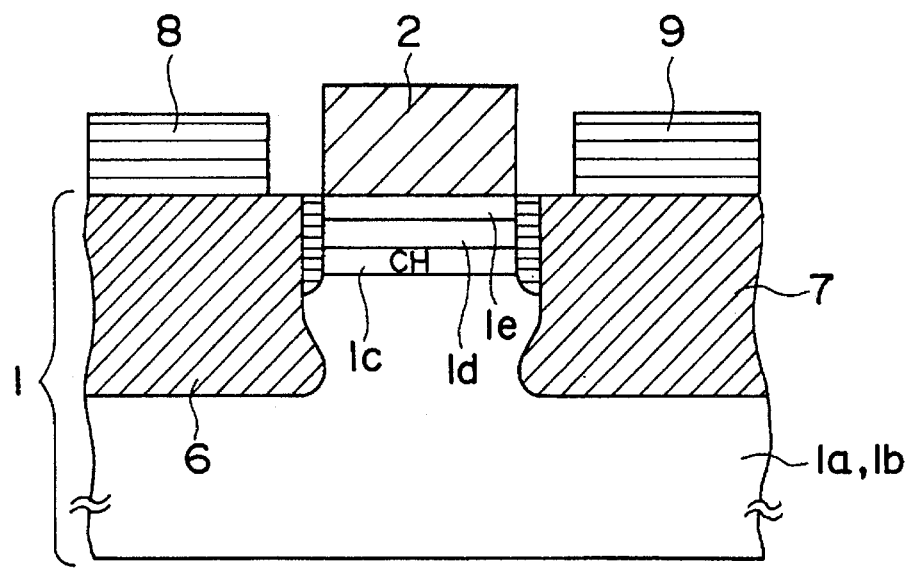
FIG. 8 is a diagram showing the construction of a short channel HFET according to various embodiments of the present invention.

Finally, the step of FIG. 8 is conducted in the present embodiment for depositing a conductor layer formed of a stacking of Au/Zn/Au layers, followed by a patterning of the same to form the source and drain electrodes 8 and 9.

In the HFET of FIG. 8, one can successfully reduce the distance between the source region 6 and the gate electrode 2 or the distance between the drain region 7 and the gate electrode 2 to 50 nm without causing any substantial increase of the gate current leak. This is a substantial improvement over the conventional device in which the distance between the source region 6 and the gate electrode 2 or the distance between the drain region 7 and the gate electrode 2 has to be set at least 200–250 nm for avoiding the gate current leak.

In the present example where the gate length is set to 0.3 μm, it should be noted that the regions 3 and 4 penetrate deeply into the substrate 1 beyond the level of the bottom boundary of the channel CH. Thereby, the horizontal as well as vertical gate leak current is effectively eliminated by suppressing the diffusion of the dopant element into the channel CH as well as the region located immediately thereunder.

In the present embodiment, one may use Be in place of the Mg dopant similarly as in the first embodiment. In this case, the ion implantation of Be is conducted at 20 keV with a dose of $1\times10^{15}$ cm$^{-2}$. Further, Ar may be used in place of F for the diffusion suppressor element. In this case, Ar may be introduced at the acceleration voltage of 70 keV and a dose of $1\times10^{15}$ cm$^{-2}$.

[fourth embodiment]

In the present embodiment, a MESFET similar to the device of the second embodiment is fabricated, wherein the MESFET of the present embodiment has a reduced gate length of 0.3 μm and exhibits a significant short-channel effect. As the fabrication process is similar to those described with reference to the second embodiment, the description hereinafter will be made with reference to FIGS. 7A–7F and further with a new drawing of FIG. 9.

Referring to FIG. 7A, an ion implantation process of Mg is conducted upon the semi-insulating GaAs substrate 11 with an acceleration voltage of 50 keV and a dose of $2\times10^{12}$ cm$^{-2}$, to form the p-type channel layer 11a therein with a thickness of 50 nm. The channel layer thus formed may correspond to the channel layer 1c of FIG. 6A. Further, a WSi layer is deposited on the substrate 11 by a sputtering process, followed by a photolithographic patterning process to form the gate electrode 12 such that the gate electrode 2 forms a gate structure having a gate length of 0.3 μm and a gate width of 100 μm.

Next, in the step of FIG. 7B, an ion implantation of F is conducted into the substrate 11 while using the gate electrode 12 as a mask with an acceleration voltage of 20 keV and a dose of $1\times10^{15}$ cm$^{-2}$, wherein the F ions thus introduced act to suppress the diffusion of Mg ions to be introduced later when forming the source and drain regions. As a result of the ion implantation of F, the regions 13 and 14 containing F ions are formed at both lateral sides of the gate electrode with a thickness of 60 nm in correspondence to the foregoing acceleration voltage of 20 keV.

Next, the step of FIG. 7C is conducted subsequently to deposit the SiO$_2$ film 15 on the entire surface of the structure of FIG. 7B with a thickness of 50 nm, followed by an anisotropic etching process of the SiO$_2$ film 15, to form the side wall covers $15_1$ at both side walls of the gate electrode 12 as indicated in FIG. 7D. Typically, the anisotropic etching process is conducted by a dry etching process.

Further, in the step of FIG. 7E, an ion implantation process of Mg is conducted under the acceleration voltage of 60 keV and the dose of $1\times10^{15}$ cm$^{-2}$ while using the gate electrode 12 as well as the SiO$_2$ covers $15_1$ thereof as a mask, to form source and drain regions 16 and 17.

Next, the side wall covers $15_1$ are removed, and a thermal annealing process is conducted at 800° C. for 5 seconds in the step of FIG. 7F so as to activate the Mg ions introduced in the step of FIG. 7E. Typically, the thermal annealing process is conducted by heating the substrate 11 by a halogen lamp. As a result of such a thermal annealing process, the Mg ions in the source and drain regions 16 and 17 are thermally agitated so as to cause a diffusion into the region between the source and drain regions 16 and 17 as indicated by arrows, while such a diffusion is effectively suppressed by the regions 13 and 14 that contains the F ions. Thus, the channel region immediately under the gate electrode 12 is held substantially free from the diffusion of Mg from the source and drain regions 16 and 17.

Figure 9:
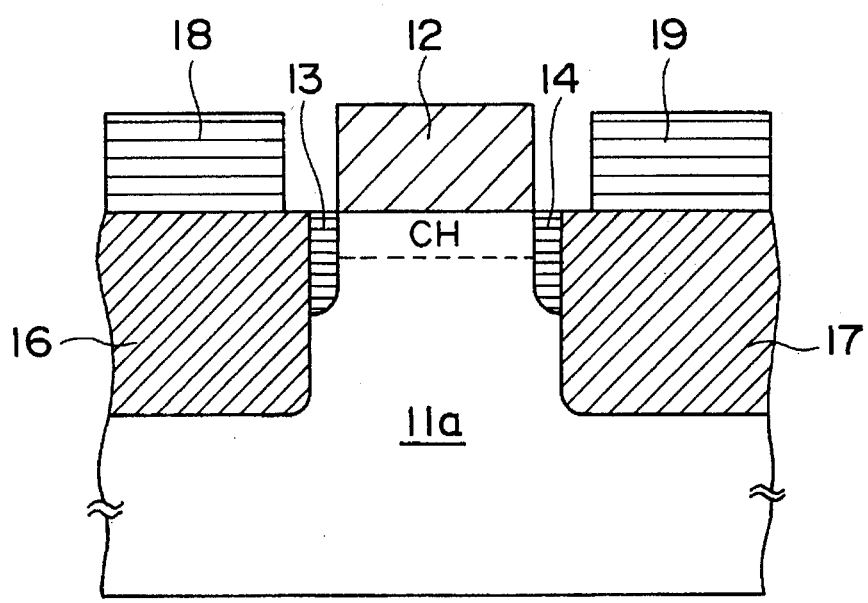
FIG. 9 is a diagram showing the construction of a short channel MESFET according to various embodiments of the present invention.

Finally, a step of FIG. 9 is conducted for depositing a conductor layer formed of a stacking of Au/Zn/Au layers, followed by a patterning of the same to form the source and drain electrodes 18 and 19.

In the field effect transistor thus formed, one can successfully reduce the distance between the source region 16 and the gate electrode 12 or the distance between the drain region 17 and the gate electrode 12 to 50 nm without causing any substantial increase of the gate current leak similarly to the first embodiment.

In the present example, the thickness of 60 nm for the regions 13 and 14 is larger than the thickness of the channel region CH formed in the channel layer 11a in correspondence to the relatively short gate length of 0.3 μm. In other words, the depth of the regions 13 and 14 exceeds the lower boundary of the channel CH as indicated in FIG. 9, similarly to the previous embodiment of FIG. 8. Further, it should be noted that one may use Be for the dopant of the source and drain regions 15 and 16. In this case, the ion implantation is conducted with an acceleration voltage of 20 keV and a dose of $1\times10^{15}$ cm$^{-2}$. Further, one may use Ar in place of F for suppressing the diffusion of the dopant element. When Ar is used, it is preferred to conduct the ion implantation process with an acceleration voltage of 70 keV and a dose of $1\times10^{15}$ cm$^{-2}$. The Be doping of the channel layer 11a may be achieved by introducing Be ions with an acceleration voltage of 15 keV and a dose of $2\times10^{12}$ cm$^{-2}$.

[fifth embodiment]

The present embodiment provides a long gate length HFET in which source and drain regions are formed by the ion implantation of Si. As the fabrication process of the device of the present embodiment is more or less the same to that of the first embodiment, the description hereinafter will be made with reference to FIGS. 6A–6G.

Referring to FIG. 6A, the buffer layer $1b$ of undoped GaAs is provided on the semi-insulating GaAs substrate $1a$ with a thickness of 500 nm, and the channel layer $1c$ of InGaAs having a composition of $In_{0.2}Ga_{0.8}As$ is provided further on the buffer layer $1b$ with a thickness of 10 nm. Further, the barrier layer $1d$ of undoped AlGaAs is provided on the channel layer $1c$ with a thickness of 30 nm, and the cap layer $1e$ of undoped GaAs is provided further thereon with a thickness of 10 nm. Further, a WSi layer is deposited on the structure thus obtained by a sputtering process, followed by a photolithographic patterning process to form the gate electrode 2 in contact with the cap layer $1d$ such that the gate electrode 2 has a gate length of 0.8 µm and a gate width of 100 µm.

Next, in the step of FIG. 6B, an ion implantation of F is conducted into the substrate 1 while using the gate electrode 2 as a mask with an acceleration voltage of 15 keV and a dose of $1\times10^{13}$ cm$^{-2}$, wherein the F ions thus introduced suppress the diffusion of Si ions to be introduced later when forming the source and drain regions 5 and 6. As a result of the ion implantation of F, the regions 3 and 4 containing F ions are formed at both lateral sides of the gate electrode 2 with a thickness of 45 nm in correspondence to the foregoing acceleration voltage of 15 keV.

Next, the step of FIG. 6C is conducted subsequently to deposit a $SiO_2$ film 5 on the entire surface of the structure of FIG. 6B with a thickness of 50 nm, followed by an anisotropic etching process of the $SiO_2$ film 5, to form side wall covers $5_1$ at both side walls of the gate electrode 2 as indicated in FIG. 6D. Typically, the anisotropic etching process is conducted by a dry etching process.

Further, in the step of FIG. 6E, an ion implantation process of Si is conducted under the acceleration voltage of 50 keV and the dose of $2\times10^{13}$ cm$^{-2}$, while using the gate electrode 2 as well as the $SiO_2$ covers $5_1$ thereof as a mask, to form the source and drain regions 6 and 7.

Next, the side wall covers $5_1$ are removed, and a thermal annealing process is conducted at 800° C. for 5 seconds in the step of FIG. 6F so as to activate the Si ions introduced in the step of FIG. 6E. Typically, the thermal annealing process is conducted by heating the substrate 1 by a halogen lamp. As a result of such a thermal annealing process, the Si ions in the source and drain regions 6 and 7 are thermally agitated so as to cause a diffusion into the region between the source and drain regions 6 and 7 as indicated by arrows, while such a diffusion is effectively suppressed by the regions 3 and 4 that contains the F ions. Thus, the channel region immediately under the gate electrode 2 is held substantially free from the diffusion of Si from the source and drain regions 6 and 7.

Finally, the step of FIG. 6G is conducted for depositing a conductor layer formed of a stacking of AuGe/Au layers, followed by a patterning of the same to form the source and drain electrodes 8 and 9.

In the field effect transistor thus formed, one can successfully reduce the distance between the source region 6 and the gate electrode 2 or the distance between the drain region 7 and the gate electrode 2 to 50 nm without causing any substantial increase of the gate current leak. This is a substantial improvement over the conventional device in which the distance between the source region 6 and the gate electrode 2 or the distance between the drain region 7 and the gate electrode 2 has to be set at least 200–250 nm for avoiding the gate current leak.

In the present example where the gate length is set to 0.8 µm, it should be noted that the thickness of 45 nm for the regions 3 and 4 is smaller than the thickness of the channel CH formed in the channel layer $1c$ for transporting the carriers. In other words, the depth of the regions 3 and 4 does not exceed the lower boundary of the channel CH as indicated in FIG. 6G. As the gate length is relatively large in the present case, the short-channel effect does not appear so significantly, and such relatively shallow diffusion suppressing regions 3 and 4 are sufficient for eliminating the lateral diffusion of the dopant element and hence the gate leak current.

[sixth embodiment]

In the present embodiment, a long gate MESFET is formed while introducing F ions directly into a semi-insulating GaAs substrate as a diffusion suppressor element for suppressing the diffusion of Si ions that are introduced into the GaAs substrate to form the source and drain regions. As the fabrication process of the device of the present embodiment is similar to that of the second embodiment, the description hereinafter will be made with reference to FIGS. 7A–7G.

In the step of to FIG. 7A, an ion implantation process of Si is conducted upon the semi-insulating GaAs substrate 11 with an acceleration voltage of 40 keV and a dose of $2\times10^{12}$ cm$^{-2}$, to form the channel layer $11a$ now doped to the n-type therein with a thickness of 50 nm. Further, a WSi layer is deposited on the substrate 11 by a sputtering process, followed by a photolithographic patterning process to form the gate electrode 12 such that the gate electrode 2 forms a gate structure having a gate length of 0.8 µm and a gate width of 100 µm.

Next, in the step of FIG. 7B, an ion implantation of F is conducted into the substrate 11 while using the gate electrode 12 as a mask with an acceleration voltage of 15 keV and a dose of $1\times10^{13}$ cm$^{-2}$, wherein the F ions thus introduced act to suppress the diffusion of Si ions to be introduced later when forming the source and drain regions. As a result of the ion implantation of F, the regions 13 and 14 containing F ions are formed at both lateral sides of the gate electrode with a thickness of 45 nm in correspondence to the foregoing acceleration voltage of 15 keV.

Next, the step of FIG. 7C is conducted subsequently to deposit the $SiO_2$ film 15 on the entire surface of the structure of FIG. 7B with a thickness of 50 nm, followed by an anisotropic etching process of the $SiO_2$ film 15, to form the side wall covers $15_1$ at both side walls of the gate electrode 12 as indicated in FIG. 7D. Typically, the anisotropic etching process is conducted by a dry etching process.

Further, in the step of FIG. 7E, an ion implantation process of Si is conducted under the acceleration voltage of 50 keV and the dose of $2\times10^{13}$ cm$^{-2}$ while using the gate electrode 12 as well as the $SiO_2$ covers $15_1$ thereof as a mask, to form the source and drain regions 16 and 17.

Next, the side wall covers $15_1$ are removed, and a thermal annealing process is conducted at 800° C. for 5 seconds in the step of FIG. 7F so as to activate the Si ions introduced in the step of FIG. 7E. Typically, the thermal annealing process is conducted by heating the substrate 11 by a halogen lamp. As a result of such a thermal annealing process, the Si ions in the source and drain regions 16 and 17 are thermally agitated so as to cause a diffusion into the region between the source and drain regions 16 and 17 as indicated by arrows, while such a diffusion is effectively suppressed by the regions 13 and 14 that contains the F ions. Thus, the channel region immediately under the gate electrode 12 is held substantially free from the diffusion of Si from the source and drain regions 16 and 17.

Finally, the step of FIG. 7G is conducted for depositing a conductor layer formed of a stacking of AuGe/Au layers, followed by a patterning of the same to form the source and drain electrodes 18 and 19.

In the field effect transistor thus formed, one can successfully reduce the distance between the source region 16 and the gate electrode 12 or the distance between the drain region 17 and the gate electrode 12 to 50 nm without causing any substantial increase of the gate current leak similarly to the first embodiment.

In the present example, too, the thickness of 45 nm for the regions 13 and 14 is smaller than the thickness of the channel region CH formed in the channel layer 11a in correspondence to the relatively large gate length of 0.8 μm. In other words, the depth of the regions 13 and 14 does not exceed the lower boundary of the channel region CH as indicated in FIG. 7G.

[seventh embodiment]

In the present embodiment, a HFET similar to that described with reference to the fifth embodiment is fabricated, wherein the gate length of the device is set to 0.3 μm that is substantially smaller than the gate length of the device of the first embodiment. As a result, the device of the present embodiment exhibits a conspicuous short-channel effect. The gate width, on the other hand, is set to 100 μm similarly as before.

As the fabrication process is similar to the process of the first embodiment, the description hereinafter for the present embodiment will be made with reference to FIGS. 6A–6F as well as FIG. 8.

Referring to FIG. 6A, the buffer layer 1b of undoped GaAs is provided on the semi-insulating GaAs substrate 1a with a thickness of 500 nm, and the channel layer 1c of undoped InGaAs having a composition of $In_{0.2}Ga_{0.8}As$ is provided further on the buffer layer 1b with a thickness of 10 nm similarly as before. Further, the barrier layer 1d of undoped AlGaAs is provided on the channel layer 1c with a thickness of 30 nm, and the cap layer 1e of undoped GaAs is provided further thereon with a thickness of 10 nm. Further, a WSi layer is deposited on the structure thus obtained by a sputtering process, followed by a photolithographic patterning process to form the gate electrode 2 in contact with the barrier layer 1d such that the gate electrode 2 has a gate length of 0.3 μm and a gate width of 100 μm.

Next, in the step of FIG. 6B, an ion implantation of F is conducted into the substrate 1 while using the gate electrode 2 as a mask with an acceleration voltage of 20 keV and a dose of $1\times10^{13}$ cm$^{-2}$, wherein the F ions thus introduced suppress the diffusion of Si ions to be introduced later when forming the source and drain regions 5 and 6. As a result of the ion implantation of F, the regions 3 and 4 containing F ions are formed at both lateral sides of the gate electrode 2 with a thickness of 60 nm in correspondence to the foregoing acceleration voltage of 20 keV.

Next, the step of FIG. 6C is conducted subsequently to deposit the $SiO_2$ film 5 on the entire surface of the structure of FIG. 6B with a thickness of 50 nm, followed by an anisotropic etching process of the $SiO_2$ film 5, to form side wall covers $5_1$ at both side walls of the gate electrode 2 as indicated in FIG. 6D. Typically, the anisotropic etching process is conducted by a dry etching process.

Further, in the step of FIG. 6E, an ion implantation process of Si is conducted under the acceleration voltage of 50 keV and the dose of $2\times10^{13}$ cm$^{-2}$ while using the gate electrode 2 as well as the $SiO_2$ covers $5_1$ thereof as a mask, to form the source and drain regions 6 and 7.

Next, the side wall covers $5_1$ are removed, and a thermal annealing process is conducted at 800° C. for 5 seconds in the step of FIG. 6F so as to activate the Si ions introduced in the step of FIG. 6E. Typically, the thermal annealing process is conducted by heating the substrate 1 by a halogen lamp. As a result of such a thermal annealing process, the Si ions in the source and drain regions 6 and 7 are thermally agitated so as to cause a diffusion into the region between the source and drain regions 6 and 7 as indicated by arrows, while such a diffusion is effectively suppressed by the regions 3 and 4 that contains the F ions. Thus, the channel region immediately under the gate electrode 2 is held substantially free from the diffusion of Si from the source and drain regions 6 and 7.

Finally, the step of FIG. 8 is conducted in the present embodiment for depositing a conductor layer formed of a stacking of AuGe/Au layers, followed by a patterning of the same to form the source and drain electrodes 8 and 9.

In the HFET of FIG. 8, one can successfully reduce the distance between the source region 6 and the gate electrode 2 or the distance between the drain region 7 and the gate electrode 2 to 50 nm without causing any substantial increase of the gate current leak. This is a substantial improvement over the conventional device in which the distance between the source region 6 and the gate electrode 2 or the distance between the drain region 7 and the gate electrode 2 has to be set at least 200–250 nm for avoiding the gate current leak.

In the present example where the gate length is set to 0.3 μm, it should be noted that the regions 3 and 4 penetrate deeply into the substrate 1 beyond the level of the bottom boundary of the channel region CH. Thereby, the horizontal as well as vertical gate leak current is effectively eliminated by suppressing the diffusion of the dopant element into the channel CH as well as the region located immediately thereunder.

[eighth embodiment]

In the present embodiment, a MESFET similar to the device of the second embodiment is fabricated, wherein the MESFET of the present embodiment has a reduced gate length of 0.3 μm and exhibits a significant short-channel effect. As the fabrication process is similar to those described with reference to the second embodiment, the description hereinafter will be made with reference to FIGS. 7A–7F and further with FIG. 9.

Referring to FIG. 7A, an ion implantation process of Si is conducted upon the semi-insulating GaAs substrate 11 with an acceleration voltage of 40 keV and a dose of $2\times10^{12}$ cm$^{-2}$, to form the channel layer 11a now doped to the n-type therein with a thickness of 50 nm. Further, a WSi layer is deposited on the substrate 11 by a sputtering process, followed by a photolithographic patterning process to form the gate electrode 12 such that the gate electrode 12 forms a gate structure having a gate length of 0.3 μm and a gate width of 100 μm.

Next, in the step of FIG. 7B, an ion implantation of F is conducted into the substrate 11 while using the gate electrode 12 as a mask with an acceleration voltage of 20 keV and a dose of $1 \times 10^{13}$ cm$^{-2}$, wherein the F ions thus introduced act to suppress the diffusion of Si ions to be introduced later when forming the source and drain regions. As a result of the ion implantation of F, the regions 13 and 14 containing F ions are formed at both lateral sides of the gate electrode with a thickness of 60 nm in correspondence to the foregoing acceleration voltage of 20 keV.

Next, the step of FIG. 7C is conducted subsequently to deposit the SiO$_2$ film 15 on the entire surface of the structure of FIG. 7B with a thickness of 50 nm, followed by an anisotropic etching process of the SiO$_2$ film 15, to form side wall covers 15$_1$ at both side walls of the gate electrode 12 as indicated in FIG. 7D. Typically, the anisotropic etching process is conducted by a dry etching process.

Further, in the step of FIG. 7E, an ion implantation process of Si is conducted under the acceleration voltage of 50 keV and the dose of $2 \times 10^{13}$ cm$^{-2}$ while using the gate electrode 12 as well as the SiO$_2$ covers 15$_1$ thereof as a mask, to form source and drain regions 16 and 17.

Next, the side wall covers 15$_1$ are removed, and a thermal annealing process is conducted at 800° C. for 5 seconds in the step of FIG. 7F so as to activate the Si ions introduced in the step of FIG. 7E. Typically, the thermal annealing process is conducted by heating the substrate 11 by a halogen lamp. As a result of such a thermal annealing process, the Si ions in the source and drain regions 16 and 17 are thermally agitated so as to cause a diffusion into the region between the source and drain regions 16 and 17 as indicated by arrows, while such a diffusion is effectively suppressed by the regions 13 and 14 that contains the F ions. Thus, the channel region immediately under the gate electrode 12 is held substantially free from the diffusion of Si from the source and drain regions 16 and 17.

Finally, a step of FIG. 9 is conducted for depositing a conductor layer formed of a stacking of AuGe/Au layers, followed by a patterning of the same to form source and drain electrodes 18 and 19.

In the field effect transistor thus formed, one can successfully reduce the distance between the source region 16 and the gate electrode 12 or the distance between the drain region 17 and the gate electrode 12 to 50 nm without causing any substantial increase of the gate current leak.

In the present example, the thickness of 60 nm for the regions 13 and 14 is larger than the thickness of the channel region CH formed in the channel layer 11a in correspondence to the relatively large gate length of 0.3 μm. In other words, the depth of the regions 13 and 14 does not exceed the lower boundary of the channel region CH as indicated in FIG. 7G, similarly to the previous embodiment.

As noted previously, one can suppress the diffusion of Mg in an AlGaAs crystal having a composition of Al$_x$Ga$_{1-y}$As by introducing Ar thereto, particularly when the compositional parameter x is set equal to or larger than 0.5.

Further, the present invention is not limited to the embodiment described heretofore, but various variations and modifications may be made without departing from the scope of the invention.

What is claimed is:

1. A field effect transistor, comprising:

a substrate of a single crystal compound semiconductor material;

a source region formed in said substrate, said source region containing a dopant element;

a drain region formed in said substrate with a separation from said source region, said drain region containing said dopant element;

a channel region defined in said substrate between said source region and said drain region, said channel region having a first end adjacent to said source region and a second, opposite end adjacent to said drain region, said channel region transporting carriers therethrough;

a gate electrode provide on said substrate so as to cover said channel region;

a pair of diffusion suppressing regions provided in said substrate respectively at said first and second ends of said channel region with a mutual separation from each other, each of said diffusion suppressing regions containing an electrically inert element and suppressing a diffusion of said dopant element therethrough.

2. A field effect transistor as claimed in claim 1, wherein said substrate is free from said diffusion suppressing element at a region located immediately under said gate electrode.

3. A field effect transistor as claimed in claim 1, wherein each of said diffusion suppressing regions contains one of F and Ar as said electrically inert element.

4. A field effect transistor as claimed in claim 1, wherein each of said source and drain regions contains one of Mg and Be as p-type dopant.

5. A field effect transistor as claimed in claim 1, wherein each of said source and drain regions contains Si as an n-type dopant.

6. A field effect transistor as claimed in claim 1, wherein said transistor further includes a barrier layer of AlGaAs under said gate electrode.

7. A field effect transistor as claimed in claim 6, wherein said barrier layer having a composition represented as Al$_x$Ga$_{1-x}$As with a compositional parameter x having a value equal to or larger than 0.5.

8. A field effect transistor as claimed in claim 1, wherein said substrate includes a channel layer of InGaAs, said channel layer including therein said channel region.

9. A field effect transistor as claimed in claim 1, wherein said channel layer has a composition represented as In$_y$Ga$_{1-y}$As, with a compositional parameter y falling in a range of $0 \leq y < 0.3$.

10. A field effect transistor as claimed in claim 1, wherein said gate electrode is provided in contact with an upper major surface of said substrate.

11. A field effect transistor as claimed in claim 10, wherein said channel region is doped to a conductivity type identical to a conductivity type of said source and drain region.

12. A field effect transistor, comprising:

a substrate of a compound semiconductor material;

a source region formed in said substrate, said source region containing a dopant element;

a drain region formed in said substrate with a separation from said source region, said drain region containing said dopant element;

a channel region defined in said substrate between said source region and said drain region, said channel region having a first end adjacent to said source region and a second, opposite end adjacent to said drain region, said channel region transporting carriers therethrough;

a gate electrode provide on said substrate so as to cover said channel region;

a pair of diffusion suppressing regions provided in said substrate respectively at said first and second ends of said channel region with a mutual separation from each other, each of said diffusion suppressing regions containing an electrically inert element and suppressing a diffusion of said dopant element therethrough, and each of said diffusion suppressing regions reaching a depth beyond a depth of a lower boundary of said channel region.

13. A field effect transistor, comprising:

a substrate of a compound semiconductor material;

a source region formed in said substrate, said source region containing a dopant element;

a drain region formed in said substrate with a separation from said source region, said drain region containing said dopant element;

a channel region defined in said substrate between said source region and said drain region, said channel region having a first end adjacent to said source region and a second, opposite end adjacent to said drain region, said channel region transporting carriers therethrough;

a gate electrode provide on said substrate so as to cover said channel region;

a pair of diffusion suppressing regions provided in said substrate respectively at said first and second ends of said channel region with a mutual separation from each other, each of said diffusion suppressing regions containing an electrically inert element and suppressing a diffusion of said dopant element therethrough, and each of said diffusion suppressing regions reaching a depth above a depth of a lower boundary of said channel region.

* * * * *